(12) United States Patent
Kotzur et al.

(10) Patent No.: US 8,650,471 B2
(45) Date of Patent: Feb. 11, 2014

(54) SYSTEM AND METHOD FOR LOOK-ASIDE PARITY BASED RAID

(75) Inventors: Gary B. Kotzur, Austin, TX (US); Surender Brahmaroutu, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 268 days.

(21) Appl. No.: 13/170,805

(22) Filed: Jun. 28, 2011

(65) Prior Publication Data
US 2013/0007572 A1    Jan. 3, 2013

(51) Int. Cl.
*G06F 11/00* (2006.01)

(52) U.S. Cl.
USPC .......................................... 714/800; 714/773

(58) Field of Classification Search
USPC ......... 710/313; 711/114; 714/6, 43, 710, 718, 714/103, 800; 713/773
See application file for complete search history.

(56) References Cited

U.S. PATENT DOCUMENTS

| | | | |
|---|---|---|---|
| 7,353,423 B2 * | 4/2008 | Hartline et al. | 714/6 |
| 7,426,611 B1 | 9/2008 | Gupta et al. | |
| 7,464,174 B1 | 12/2008 | Ngai | |
| 7,500,115 B2 | 3/2009 | Berke et al. | |
| 7,562,176 B2 | 7/2009 | Kloeppner et al. | |
| 7,636,814 B1 | 12/2009 | Karr et al. | |
| 7,734,858 B2 | 6/2010 | Loffink et al. | |
| 7,801,120 B2 | 9/2010 | Steinmetz et al. | |
| 7,890,615 B2 | 2/2011 | Kacin et al. | |
| 2004/0225926 A1 * | 11/2004 | Scales et al. | 714/43 |
| 2006/0236161 A1 * | 10/2006 | Tanaka et al. | 714/710 |
| 2006/0265656 A1 | 11/2006 | Lambert et al. | |
| 2007/0011383 A1 | 1/2007 | Berke et al. | |
| 2010/0125653 A1 | 5/2010 | Cherian et al. | |
| 2012/0005539 A1 | 1/2012 | Paul et al. | |
| 2012/0059978 A1 * | 3/2012 | Rosenband et al. | 711/103 |
| 2012/0239849 A1 * | 9/2012 | Brahmaroutu et al. | 710/313 |
| 2013/0019062 A1 * | 1/2013 | Bennett et al. | 711/114 |
| 2013/0124932 A1 * | 5/2013 | Schuh et al. | 714/718 |

* cited by examiner

*Primary Examiner* — David Ton
(74) *Attorney, Agent, or Firm* — Terrile, Cannatti, Chambers & Holland, LLP; Robert W. Holland

(57) ABSTRACT

Redundant storage of information is provided by distributing storage functions between a RAID controller and switching device. The switching device multi-casts writes to storage devices and to the RAID controller. The RAID controller generates parity for the information and writes the parity to the storage devices in space reserved for parity by the switching device. Information is read from the storage devices through the switching device without action by the RAID controller.

20 Claims, 2 Drawing Sheets

SYSTEM AND METHOD FOR LOOK-ASIDE PARITY BASED RAID

BACKGROUND OF THE INVENTION

1. Field of the Invention

The present invention relates in general to the field of information handling system storage devices, and more particularly to a system and method for look-aside parity based RAID.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems generate and manage large quantities of information. To prevent inadvertent loss of information due to storage device failures, information handling system users often store information with redundancy, such as by using a Redundant Array of Independent Disks (RAID) or similar systems that replicate information on multiple storage devices. If a storage device fails, then information from other storage devices may be used to re-create the failed storage device. A basic RAID system simply mirrors each storage device as writes are made so that an exact copy of each storage device is maintained. More complex RAID systems, such as RAID 4, 5 and 6 systems, use parity to maintain stripes of information spread across three or more drives. Parity-based systems make more efficient use of storage device space by copying stripes, which are smaller increments of information, and then tracking the storage devices that maintain each stripe using parity. If a storage device fails, then a parity operation uses the parity information to retrieve stripes from operational storage devices and copies the stripes to a replacement storage device so that the content of the failed storage device is re-created at the replacement storage device.

Although RAID can be implemented with software executing on a host information handling system processor, more efficient storage operations typically use a hardware RAID controller executing firmware to perform RAID functions. One common mode for performing RAID writes is the write-through (WT) mode. The WT mode uses local dynamic memory DRAM of the RAID controller to temporarily store intermittent states of information and parity until the information and parity are ready to write to a storage device. Once the information and parity is written to the storage device, the RAID controller sends a completion message to the host information handling system. Another common mode for performing RAID writes is the write-back (WB) mode. The WB mode uses DRAM of the RAID controller to temporarily store information and parity, but instead of waiting to send a completion to the host, the completion is sent immediately upon receiving a write from the host. After sending the completion, the remaining operations up to writing content to the storage devices are handled as background instructions. RAID controllers that use WB mode typically also have a battery-backed cache to protect information in the event of a power failure before the background instructions are completed.

Traditionally, RAID systems included an array of hard disk drives that store information on rotating magnetic media. Recently, solid state drives have become less expensive, making them an option for use as storage devices in RAID systems. RAID controllers generally used the WT mode with hard disk drives unless high performance applications required more rapid information storage. With solid state drives, the overhead of WB mode operations tends to overwhelm the RAID controller, slowing system performance too much. Because of this, RAID systems that use solid state drive tend to use the WT mode. Another difference with solid state drive arrays is that PCIe interfaces are generally preferred to communicate between a RAID controller and storage devices instead of SATA, SAS or Fibre-Channel interfaces. Solid state drives use flash memory to store information, which has reduced latency relative to rotating magnetic media. PCIe solid state drives directly attach to the root complex, offering reduced latency for storage solutions. Using either the WT or WB mode of writing information to an array of solid state drives from a RAID controller tends to degrade the reduced latency available from solid state drives and PCIe interfaces because the technique of retaining information in local DRAM tends to burden the RAID controller, creating a bottleneck.

SUMMARY OF THE INVENTION

Therefore a need has arisen for a system and method which provides look-aside parity-based RAID storage.

In accordance with the present invention, a system and method are provided which substantially reduce the disadvantages and problems associated with previous methods and systems for storing information in an array of storage devices using parity. Look aside parity is performed by mirroring information writes from a switching device to both a storage array controller and one or more of plural storage devices. The storage array controller generates parity information to support redundant information storage and writes parity information to the one or more of plural storage devices by using the mirrored information and old parity information retrieved from the storage devices.

More specifically, a host information handling system supports storage of information by plural client information handling systems through a network, such as a storage area network. The host information handling system executes a storage application, which issues write commands for writing information to one or more of plural storage devices, such as solid state drives. A switching device, such as a PCIe 3.0 switch, receives the write command and multi-casts information for the write to both a RAID controller and one or more of plural storage devices, such as solid state drives. The switching device creates stripes from the information and sets aside space in each stripe for parity information, and then writes each stripe to the one or more of plural storage devices. The RAID controller accepts the mirrored information from the switching device and retrieves old information and parity information associated with the mirrored information from the storage devices. For example, with solid state drives, old information is not invalidated for a new write until the RAID controller retrieves the old information. The RAID controller applies the mirrored information, the old information and the parity information to generate new parity information. The RAID controller then writes the new parity information to each of the stripes created and written by the switching device. Reads of information for the storage devices are performed with the root PCIe structure through the switching device without invoking operations by the RAID controller.

The present invention provides a number of important technical advantages. One example of an important technical advantage is that memory and multi-cast capability of a PCIe switch are leveraged in a RAID environment to reduce congestion at a RAID controller during write operations. Look-aside parity moves at least some RAID parity operations to a switching device, such as a PCIe switch or SAS expander, to generate parity during non-degraded states. Distributing RAID operations between the RAID controller and switching device provides lower latencies, such as with user access directly to solid state drives rather than cached through RAID controller memory. Distributed RAID operations improve bandwidth utilization in a storage array and reduce the risk that a bottleneck will form at the RAID controller to slow down information writes and reads. The reduced risk of a bottleneck at the RAID controller is provided by distributing information movement operations from the RAID controller to the PCIe switch and preserving RAID resources to perform parity operations.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system stores information with redundancy by look-aside parity generation where a RAID controller creates parity from a mirror of information stored in an array of storage devices. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
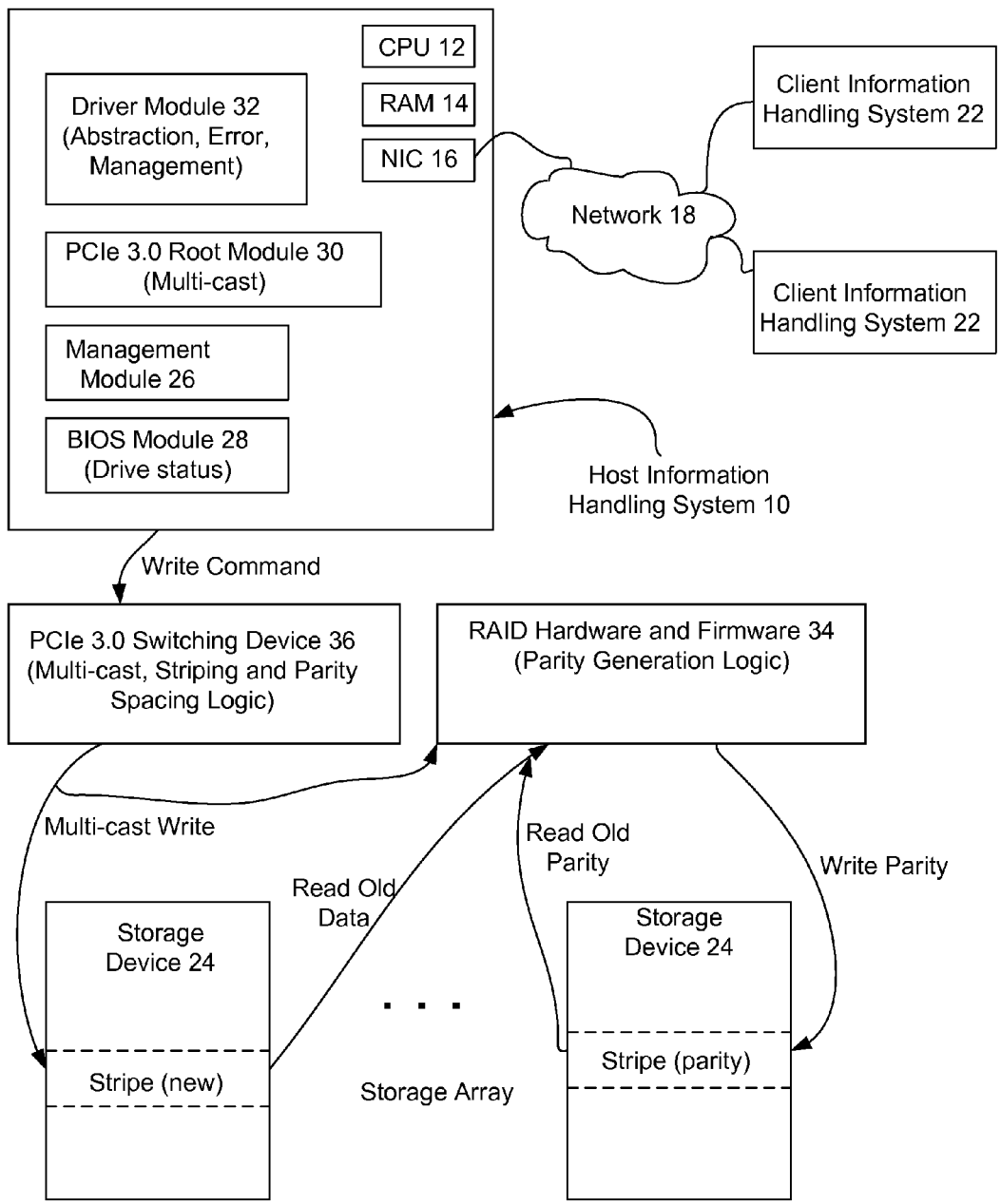
FIG. 1 depicts a block diagram of an information handling system having information storage redundancy with look-aside parity based RAID.

Referring now to FIG. 1, a block diagram depicts an information handling system 10 having information storage redundancy with look-aside parity based RAID. Information handling system 10 is built from plural processing components that cooperate to process information, such as a processor 12 that executes instructions, RAM 14 that stores instructions and information to aid execution of instructions by processor 12, and a network interface card 16 that provides communication with other devices through a network 18. For example, information handling system 10 executes a storage application 20 which allows client information handling systems 22 to access storage devices 24 using information handling system 10 as a host. Storage application 20 provides conventional storage network host services through application and firmware modules, such as a management module 26, BIOS module 28 and PCIe 3.0 root module 30. Requests for storage access, such as write and read requests received through network 18 from client information handling systems 22 are handled through a driver module 32 that performs abstraction, error handling and management interface functions in a substantially conventional manner. Drive module 32 supports look-aside based RAID parity by moving data transfer operations from performance at a RAID controller 34 to a PCIe switch 36.

Look-aside RAID parity supported through PCIe switch 36 and RAID controller 34 calculates parity to support redundant information storage after information is stored at a storage device 24. In order to calculate the parity for an update to information already stored on a storage device 24, the parity already stored on storage devices 24 for information to be updated is not invalidated until after a new write of parity information is issued. When host information handling system 10 issues a write command, drive module 32 provides the write command and information to PCIe switch 36, which has a version 3.0 or later that supports multi-casting of information. Logic executing in firmware of PCIe switch 36 stripes the information to be written to storage devices 24 and reserves space associated with the stripes for parity information that will subsequently be written by RAID controller 34. For example, a process to stripe information for writes disclosed by U.S. patent application Ser. No. 13/048,327, filed on Mar. 15, 2011, assigned to Dell Products L.P. may be used, and is incorporated herein as if fully set forth. The logic in PCIe switch 36 then multi-casts each stripe with one copy written to a storage device 24 and a mirror copy sent to RAID controller 34. RAID controller 34 uses the mirror copy of write traffic received from switch 36 to generate parity for each stripe by reading old stripe information and parity from storage devices 24, generating new parity with a comparison of old stripe information and new write information, and then writing the newly generated parity information to storage devices 24. Storage devices 24 maintain old redundant information and parity information until new parity information is prepared by RAID controller 34. For example, when storage devices 24 are solid state drives, the old parity information and redundant information is not invalidated to prepare for a write of new data until the new parity data write command is issued by RAID controller 34.

During normal operations, look-aside RAID reduces traffic through RAID controller 34 by initiating writes directly to storage devices 24 and generating parity information for redundancy after the write is initiated and mirrored to RAID controller 34. Read commands issued by host information handling system 10 proceed directly through the root of the PCIe structure and switch 36 and to storage devices 24 so that no read traffic need pass through RAID controller 34 in the performance of non-degraded read operations. Thus, during normal operations, the only responsibility handled by RAID controller 34 is generation of parity and writing parity to storage devices 24. Space for writing parity is reserved by switch 36 when stripes are defined. Parity can be accomplished by a maintaining a dedicated parity drive of using a rotating pattern to balance the performance of the storage system. Although the example embodiment disclosed by FIG. 1 uses a PCIe 3.0 or better switch 36 and solid state drives 24, in alternative embodiments, other types of storage infrastructure may be used. For example, an SAS expander or other switching device may be used instead of PCIe switch 36, or a hard disk drive or other types of storage devices may be used instead of solid state drives. As another example, SAS or SATA infrastructure may be used instead of PCIe infrastructure for communicating between host information handling system 10, RAID controller 34, switching device 36 and storage devices 24. Switching device 24 in alternative embodiments provides striping of information and mirroring to RAID controller 34 so that parity is performed looking aside from the write of the information to the storage devices 24. Should degrade operations result, such as with the failure of a solid state drive, then RAID controller 34 re-builds the failed drive in a conventional manner.

Figure 2:
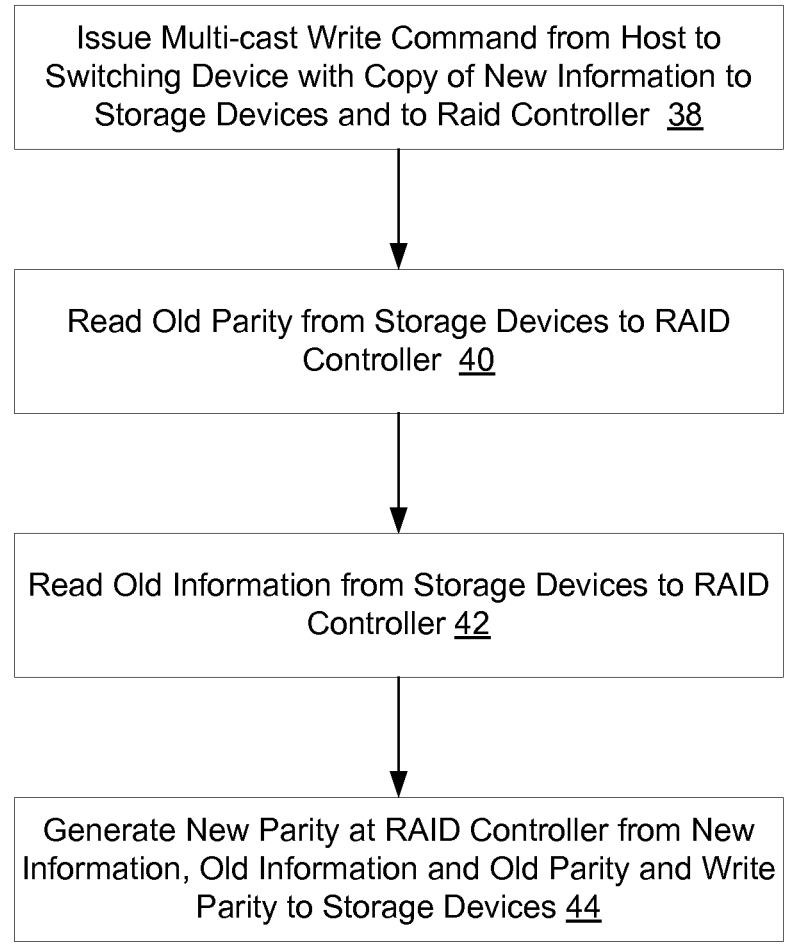
FIG. 2 depicts a flow diagram of a process for look-aside parity generation to support redundant information storage.

Referring now to FIG. 2, a flow diagram depicts a process for look-aside parity generation to support redundant information storage. The process starts at step 38 with the host issuing a multi-cast write command to write information with a copy to storage devices and a copy to the RAID controller. In response to the write command, the switching device that receives the write command stripes the information to be written with space set aside for the subsequent addition of parity information and mirrors the information to the RAID controller. At step 40, the RAID controller reads old information associated with the write from the storage devices, such as previous stripes of redundant information that are not invalidated until parity generation is complete. At step 42, the RAID controller reads old parity information associated with the write from the storage devices. The RAID controller buffers the new information, the old information and the parity information to generate new parity information for each stripe of new information. Once new parity information is generated, at step 44 the RAID controller writes the parity to each respective stripe of new information to complete the overall redundant storage of information.

Although the present invention has been described in detail, it should be understood that various changes, substitutions and alterations can be made hereto without departing from the spirit and scope of the invention as defined by the appended claims.

What is claimed is:

1. A method for redundantly storing information in an array of plural storage devices, the method comprising:
issuing a write command from a host information handling system to a switching device interfaced with the storage devices, the write command for writing predetermined information at the storage devices;
mirroring the predetermined information with the switching device to one or more of the storage devices and to an array controller;
generating parity for the predetermined information with the array controller; and
writing the parity from the array controller to the storage devices.

2. The method of claim 1 wherein mirroring further comprises:
creating stripes of the predetermined information at the switching device; and
writing the stripes to the one or more storage devices.

3. The method of claim 2 further comprising providing unused space with each stripe for storing parity information.

4. The method of claim 3 wherein writing the parity from the array controller to the storage devices further comprises writing the parity to the unused space of each stripe.

5. The method of claim 1 wherein generating parity for the predetermined information further comprises:
buffering the predetermined information at the array controller;
recalling parity information from the one or more storage devices; and
applying the predetermined information and the recalling parity information to generate the parity.

6. The method of claim 1 wherein generating parity further comprises:
identifying associated information stored on the one or more storage devices; and
retaining the associated information on the one or more storage devices until the array controller retrieves the associated information for use in generating the parity.

7. The method of claim 1 wherein the array of plural storage devices comprise solid state drives and the switching device comprises a PCIe switch.

8. The method of claim 7 wherein the array controller comprises a RAID controller.

9. The method of claim 1 wherein the switching device comprises an SAS expander.

10. The method of claim 1 further comprising:
issuing a read command from a host information handling system to a switching device interfaced with the storage devices, the read command for reading predetermined information from the storage devices; and
reading the predetermined information with the switching device to bypass the RAID controller.

11. An information handling system comprising:
a processor operable to execute applications;
a storage application running on the processor and operable to issue write commands to write information to one or more storage devices of a storage array;
an array controller interfaced with the processor and operable to generate parity for the information, the parity providing redundancy of the information at the one or more storage devices; and
a switching device interfaced with the processor and the array controller, the switching device operable to receive the write commands to write the information, and in response to the write commands, to write the information to the one or more storage devices and to mirror the information to the array controller.

12. The information handling system of claim 11 wherein the array controller generates parity for the information by comparing the information mirrored from the switching device with information read from the storage devices.

13. The information handling system of claim 11 wherein the switching device is further operable to write the information to the storage devices with unused space reserved for parity information and the array controller is further operable to write parity to the unused space.

14. The information handling system of claim 11 wherein the switching device comprises a PCIe switch and the storage devices comprise solid state drives.

15. The information handling system of claim 14 wherein the storage application is further operable to issue a read command to read information from the storage devices through the PCIe switch without invoking the array controller.

16. The information handling system of claim 11 wherein the switching device writes the information as stripes of data and the array controller comprises a RAID controller that generates parity for each stripe of data by retrieving parity for the stripe from previous writes to the storage devices.

17. The information handling system of claim 11 wherein the switching device comprises an SAS expander.

18. A system for storing information with redundancy, the system comprising:
   a switching device operable to receive a write command to write information to one or more of plural storage devices, to write the information as stripes at the one or more plural storage devices, and to mirror the stripes to an array controller; and
   an array controller operable to receive the stripes mirrored from the switching device, to generate parity for the stripes and to write the parity to the one or more of plural storage devices.

19. The system of claim 18 wherein the array controller is further operable to retrieve old parity from the one or more of plural storage devices that is associated with the information and apply the old parity to generate the parity.

20. The system of claim 18 wherein the switching device is further operable to receive a read command to read the information from the one or more of plural storage devices and in response to the read command to read the information without invoking the array controller.

* * * * *